(12) United States Patent
Lin et al.

(10) Patent No.: US 8,723,257 B2
(45) Date of Patent: May 13, 2014

(54) ESD PROTECTION DEVICE HAVING REDUCED EQUIVALENT CAPACITANCE

(75) Inventors: Ta-Cheng Lin, Hsinchu (TW); Chien-Kuo Wang, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 1068 days.

(21) Appl. No.: 12/334,853

(22) Filed: Dec. 15, 2008

(65) Prior Publication Data

US 2010/0148265 A1   Jun. 17, 2010

(51) Int. Cl.
*H01L 29/78* (2006.01)

(52) U.S. Cl.
USPC .......................................................... 257/337

(58) Field of Classification Search
USPC .......... 257/337, 571, 586, E27.015, E27.053, 257/E29.044
See application file for complete search history.

(56) References Cited

U.S. PATENT DOCUMENTS

| 5,504,362 | A  | * | 4/1996 | Pelella et al. | 257/357 |
| 6,600,211 | B1 | * | 7/2003 | Collins | 257/565 |
| 2007/0040220 | A1 |   | 2/2007 | Chen et al. | |
| 2008/0203534 | A1 | * | 8/2008 | Xu et al. | 257/577 |
| 2009/0108346 | A1 | * | 4/2009 | Cai | 257/337 |

OTHER PUBLICATIONS

Richier et al. "Investigation on Different ESD Protection Strategies Devoted to 3.3 V RF Applications (2 Ghz) in a 0.18um CMOS Process", Sep. 26-28, 2000, France.

\* cited by examiner

*Primary Examiner* — Thomas L Dickey
(74) *Attorney, Agent, or Firm* — WPAT, PC; Justin King

(57) ABSTRACT

An ESD protection device includes a substrate of a first conductivity type, a well region of a second conductivity type, a first doped region of the second conductivity type, a second doped region of the first conductivity type, a third doped region of the second conductivity type, a fourth doped region of the first conductivity type. The well region is configured in the substrate. The first doped region is configured in the well region. The second doped region is configured in the well region and surrounding the first doped region. The third doped region is configured in the well region and surrounding the first doped region and the second doped region. The fourth doped region is configured in the well region and under the first doped region and the second doped region. The fourth doped region is coupled with the first doped region and with the second doped region, respectively.

18 Claims, 7 Drawing Sheets

ESD PROTECTION DEVICE HAVING REDUCED EQUIVALENT CAPACITANCE

BACKGROUND OF THE INVENTION

1. Field of the Invention

The present invention relates to an integrated circuit, and in particular, to an electrostatic discharge (ESD) protection device.

2. Description of Related Art

ESD is the main factor of electrical overstress (EOS) which causes damage to most of electronic devices or systems. Such damage can result in the permanent damage of semiconductor devices and computer systems, so that the circuit function of integrated circuits (ICs) is affected and the operation of electronic products is abnormal. Accordingly, a number of methods have been developed to protect semiconductor IC devices against possible ESD damages. The most common type of ESD protection is the incorporation of a specific hardware inside the IC package. A specially-designed ESD protection device set up between an input pad and an internal device is utmostly required, so as to protect the internal device.

The conventional complementary metal oxide semiconductor (CMOS) process involves gate-grounded NMOS (GGNMOS), silicon-controlled rectifier (SCR) or diode for the ESD protection. However, each of the forgoing devices cannot satisfy the requirements for high speed applications or for radio frequency (RF) applications.

The GGNMOS is usually designed in a larger scale due to disposition of a parasitic bipolar junction transistor (BJT), and has a higher equivalent capacitance $C_{ESD}$ which causes function failure. As the circuits and the devices are continuously miniaturized along with the rapid progress in techniques of the semiconductor process, gate oxide of the GGNMOS could endure the high voltage of the ESD no longer. Although the SCR has a smaller equivalent capacitance $C_{ESD}$, it usually requires a higher trigger voltage. An additional trigger circuit is therefore demanded for the SCR, leading to a great increase in the utilized silicon area. The equivalent capacitance $C_{ESD}$ of the diode is a bit larger than that of the SCR, yet the equivalent capacitance $C_{ESD}$ of the diode is still restricted in the applications to GHz.

SUMMARY OF THE INVENTION

Accordingly, the present invention is directed to an ESD protection device suitable for high speed or RF applications.

The ESD protection device of the present invention includes an N-well region, a first N-type doped region, a first P-type doped region, a second N-type doped region, and a second P-type doped region. The N-well region is configured in a substrate. The first N-type doped region is configured in the N-well region. The first P-type doped region is configured in the N-well region, and surrounds the first N-type doped region. The second N-type doped region is configured in the N-well region, and surrounds the first N-type doped region and the first P-type doped region. The second P-type doped region is configured in the N-well region and under the first N-type doped region and the first P-type doped region. The second P-type doped region is coupled with the first N-type doped region and with the first P-type doped region, respectively.

According to an embodiment of the present invention, the ESD protection device further includes a first salicide layer and a second salicide layer. The first salicide layer is disposed on a surface of the first N-type doped region. The second salicide layer is disposed on a surface of the second N-type doped region. The second silicide layer may be further disposed on at least a portion of a surface of the first P-type doped region.

According to an embodiment of the present invention, the second N-type doped region and the first P-type doped region are separated from each other.

According to an embodiment of the present invention, the ESD protection device further includes an isolation structure, disposed between the second N-type doped region and the first P-type doped region.

According to an embodiment of the present invention, the ESD protection device further includes an isolation structure, disposed between the N-well region and the substrate.

According to an embodiment of the present invention, a doping concentration of the second P-type doped region is higher than a doping concentration of the N-well region and is lower than a doping concentration of the first P-type doped region.

According to an embodiment of the present invention, the first N-type doped region is coupled to a collector terminal and the second N-type doped region is coupled to an emitter terminal.

According to an embodiment of the present invention, the first N-type doped region is coupled to an emitter terminal and the second N-type doped region is coupled to a collector terminal.

The ESD protection device of the present invention includes a substrate of a first conductivity type, a well region of a second conductivity type, a first doped region of the second conductivity type, a second doped region of the first conductivity type, a third doped region of the second conductivity type, a fourth doped region of the first conductivity type. The well region is configured in the substrate. The first doped region is configured in the well region. The second doped region is configured in the well region and surrounds the first doped region. The third doped region is configured in the well region and surrounds the first doped region and the second doped region. The fourth doped region is configured in the well region and under the first doped region and the second doped region. The fourth doped region is coupled with the first doped region and with the second doped region, respectively.

According to an embodiment of the present invention, the ESD protection device further includes a first salicide layer and a second salicide layer. The first salicide layer is disposed on a surface of the first doped region. The second salicide layer is disposed on a surface of the third doped region. The second silicide layer can be further disposed on at least a portion of a surface of the second doped region.

According to an embodiment of the present invention, the third doped region and the second doped region are separated from each other.

According to an embodiment of the present invention, the ESD protection device further includes an isolation structure, disposed between the third doped region and the second doped region.

According to an embodiment of the present invention, the ESD protection device further includes an isolation structure, disposed between the well region and the substrate.

According to an embodiment of the present invention, a doping concentration of the fourth doped region is higher than a doping concentration of the well region and is lower than a doping concentration of the second doped region.

According to an embodiment of the present invention, the first doped region is coupled to a collector terminal and the third doped region is coupled to an emitter terminal.

According to an embodiment of the present invention, the first doped region is coupled to an emitter terminal and the third doped region is coupled to a collector terminal.

According to an embodiment of the present invention, the first conductivity type is P-type and the second conductivity is N-type.

According to an embodiment of the present invention, the first conductivity type is N-type and the second conductivity is P-type.

As mentioned above, the ESD protection device in the present invention includes the first doped region of the second conductivity type, the fourth doped region of the first conductivity type underneath the first doped region, and the well region of the second conductivity type, which form a vertical bipolar transistor jointly. Hence, the equivalent capacitance $C_{ESD}$ and the designed area of the ESD protection device can be reduced effectively.

Moreover, the ESD protection device in the present invention can be applicable to various ESD protections, especially to high speed or RF IO (input/output) circuits. Also, the fabrication of the ESD protection device can be entirely integrated with the existing logic process, such that the process is simple and the chip area can be put to more efficacious use.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
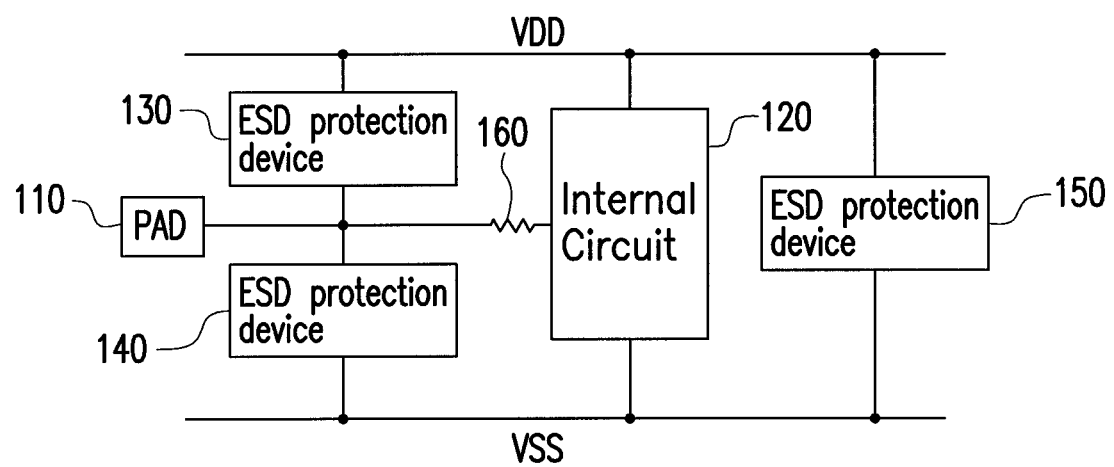
FIG. 1 depicts, in a block diagram, an integrated circuit (IC) with an ESD protection device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 depicts, in a block diagram, an integrated circuit (IC) with an ESD protection device according to an embodiment of the present invention. For illustration purposes, the following disclosure is described in terms of two power rails VDD and VSS, which are illustrated only as an exemplary example, and should not be adopted for limiting the scope of the present invention to an application of single system voltage.

Referring to FIG. 1, in the IC, an internal circuit 120 inputs or outputs a signal through a bonding pad 110. The power for the internal circuit 120 is provided from the outside through the power rails VDD and VSS. In an embodiment, the power rail VDD is a system voltage rail, and the power rail VSS is a ground rail. In general operation, the power rails VSS and VDD are suitable to provide a ground voltage and a system voltage for the internal circuit 120, respectively. An ESD protection device 130 is electrically connected between the power rail VDD and the bonding pad 110. An ESD protection device 140 is electrically connected between the power rail VSS and the bonding pad 110. An ESD protection device 150 is electrically connected between the power rail VDD and the power rail VSS. A resistance 160 is electrically connected between the bonding pad 110 and the internal circuit 120. The ESD protection devices 130, 140 and 150 can be identical to or different from one another in circuit design.

The resistance 160 can block most of the ESD current from flowing into the internal circuit 120, while the ESD protection devices 130, 140 and 150 can conduct the sudden ESD pulse current to the power rails VDD and VSS respectively. Accordingly, the ESD pulse current can be prevented from impacting on the internal circuit 120 directly. In an embodiment, when the bonding pad 110 produces a positive pulse current due to the ESD, the resistance 160 can prevent most of the positive pulse current from flowing into the internal circuit 120, and simultaneously, the ESD protection device 130 can guide most of the positive pulse current to the power rail VDD. Likewise, when the bonding pad 110 produces a negative pulse current due to the ESD, the resistance 160 can prevent most of the negative pulse current from flowing into the internal circuit 120, and simultaneously, the ESD protection device 140 can guide most of the negative pulse current to the power rail VSS.

Figure 2A:
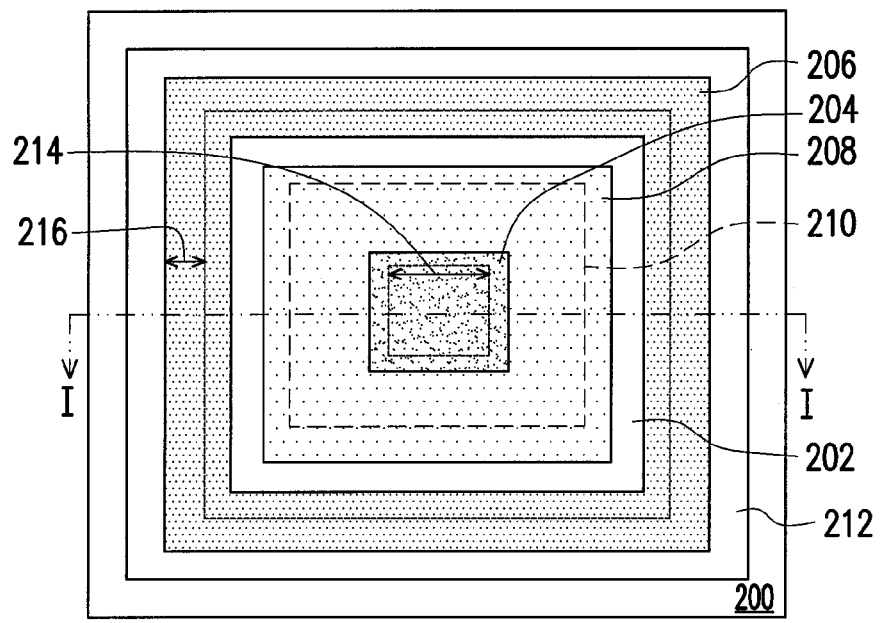
FIG. 2A schematically illustrates a top view of the ESD protection device according to a first embodiment of the present invention.
Figure 2B:
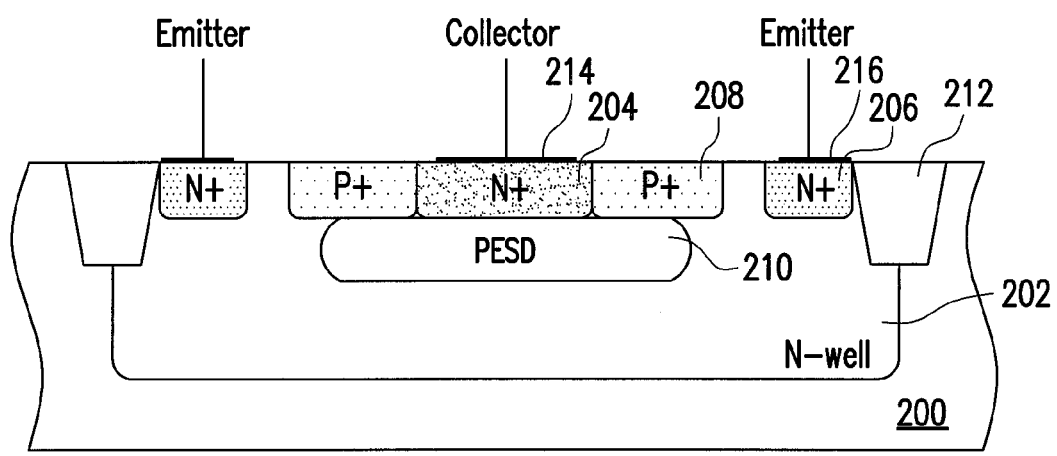
FIG. 2B is schematic, cross-sectional diagram of the ESD protection device shown in FIG. 2A along line I-I according to an example of the first embodiment of the present invention.
Figure 2C:
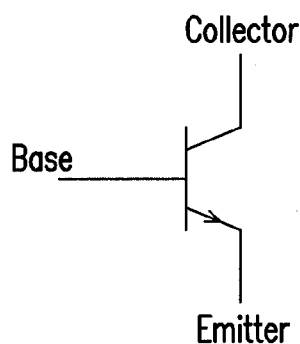
FIG. 2C depicts schematically, in an equivalent circuit, a vertical bipolar junction transistor (BJT) in the ESD protection device according to an embodiment of the present invention.

The ESD protection device according to embodiments of the present invention is then illustrated with a schematic top view and a cross-sectional diagram. FIG. 2A schematically illustrates a top view of the ESD protection device according to a first embodiment of the present invention. FIG. 2B is schematic, cross-sectional diagram of the ESD protection device shown in FIG. 2A along line I-I according to an example of the first embodiment of the present invention. FIG. 2C depicts schematically, in an equivalent circuit, a vertical bipolar junction transistor (BJT) in the ESD protection device according to an embodiment of the present invention.

Referring concurrently to FIGS. 2A and 2B, the ESD protection device of the present invention is deployed in a P-type substrate 200, for example. The ESD protection device includes an N-well region 202, a first N-type doped region 204, a second N-type doped region 206, a first P-type doped region 208 and a second P-type doped region 210.

The N-well region 202 is configured in the substrate 200. The first N-type doped region 204, such as an N+ doped region, is configured in the N-well region 202. The first P-type doped region 208, such as a P+ doped region, is configured in the N-well region 202 and surrounds the first N-type doped region 204. The second N-type doped region 206, such as an N+ doped region, is configured in the N-well region 202. The second N-type doped region 206 can be designed in the form of a frame, and surround the first N-type doped region 204 and the first P-type doped region 208 within the border of the N-well region 202. In an embodiment, the second N-type doped region 206 and the first P-type doped-region 208 are separated from each other. The first N-type doped region 204, the second N-type doped region 206 and the first P-type doped region 208 may constitute a portion of the upper surface of the N-well region 202.

The second P-type doped region 210, such as a PESD doped region, is configured in the N-well region 202. The second P-type doped region 210 is disposed underneath the first N-type doped region 204 and the first P-type doped region 208. The second P-type doped region 210 is coupled with the first N-type doped region 204 and with the first P-type doped region 208, respectively. The first N-type doped region 204 and the underneath second P-type doped region 210 contact to each other, so as to form an N-P junction therebetween. The doping concentration of the second P-type doped region 210 is higher than that of the N-well region 202, and is also lower than that of the first P-type doped region 208, for example.

As shown in FIGS. 2A and 2B, the ESD protection device can further include an isolation structure 212 and salicide layers 214 and 216. The isolation structure 212 is disposed, for example, between the N-well region 202 and the substrate 200. In an embodiment, the isolation structure 212 encircles the profile of the second N-type doped region 206. That is to say, the ESD protection device is deployed in the region defined by the isolation structure 212. The isolation structure 212 can be a shallow trench isolation (STI) structure.

The salicide layer 214 is disposed on the surface of the first N-type doped region 204, and the salicide layer 216 is disposed on the surface of the second N-type doped region 206. In an embodiment, a salicide block (SAB) layer having a frame configuration can be formed on the surface of the substrate 200 to cover the first P-type doped region 208, partial first N-type doped region 204 and partial second N-type doped region 206. The occurrence of a short circuit among the three terminal of the ESD protection device resulting from the connection between the salicide layers 214 and 216 on the surface of the substrate 200 can be prevented by the SAB layer. In an embodiment, contact plugs (not shown) may further be formed on the first N-type doped region 204 and on the second N-type doped region 206, and the resistance can be reduced due to the disposition of the salicide layers 214 and 216.

Referring to FIG. 2B again, in an example, the N-well region 202 serves as an emitter and is coupled to the second N-type doped region 206. The first N-type doped region 204 deployed in the central portion serves as a collector. The second P-type doped region 210 underneath the first N-type doped region 204 and the first P-type doped region 208 surrounding the side of the first N-type doped region 204 constitute a base to compass the collector therein jointly. Accordingly, the combination of the first N-type doped region 204, the second P-type doped region 210 and the N-well region 202 forms a vertical NPN bipolar transistor, as shown in FIG. 2C, which includes a Zener diode and a P+/N-well diode connected back to back in series. The total capacitance of the vertical BJT equals the series capacitance of two junctions, and therefore, the equivalent capacitance $C_{ESD}$ can be reduced effectively.

It should be noted that the conductivity type of each element in the foregoing example is provided for illustration purposes, and is not construed as limiting the scope of the present invention. It is appreciated by persons skilled in the art that the conductivity type depicted in FIG. 2B can be exchanged, that is to say, a vertical PNP bipolar transistor can also be utilized in the ESD protection device.

Figure 2D:
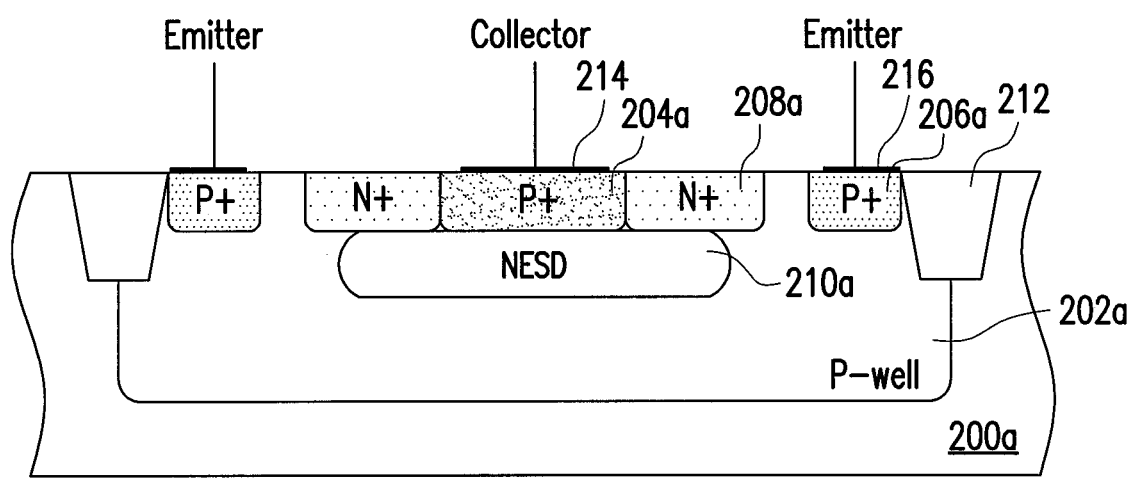
FIG. 2D is schematic, cross-sectional diagram of the ESD protection device according to another example of the first embodiment of the present invention.

FIG. 2D is schematic, cross-sectional diagram of the ESD protection device according to another example of the first embodiment of the present invention.

As shown in FIG. 2D, the ESD protection device in this example is deployed in a N-type substrate 200a. The ESD protection device includes a P-well region 202a, a first P-type doped region 204a, a second P-type doped region 206a, a first N-type doped region 208a and a second N-type doped region 210a. The P-well region 202a is configured in the substrate 200a. The first P-type doped region 204a is configured in the P-well region 202a. The first N-type doped region 208a is configured in the P-well region 202a and surrounds the first P-type doped region 204a. The second P-type doped region 206a is configured in the P-well region 202a. The second P-type doped region 206a surrounds the first P-type doped region 204a and the first N-type doped region 208a within the border of the P-well region 202a. The second N-type doped region 210a, designated as a NESD, is configured in the P-well region 202a, and disposed underneath the first P-type doped region 204a and the first N-type doped region 208a. The second N-type doped region 210a is coupled with the first P-type doped region 204a and with the first N-type doped region 208a, respectively. The combination of the first P-type doped region 204a, the second N-type doped region 210a and the P-well region 202a thus forms the vertical PNP bipolar transistor.

Figure 3A:
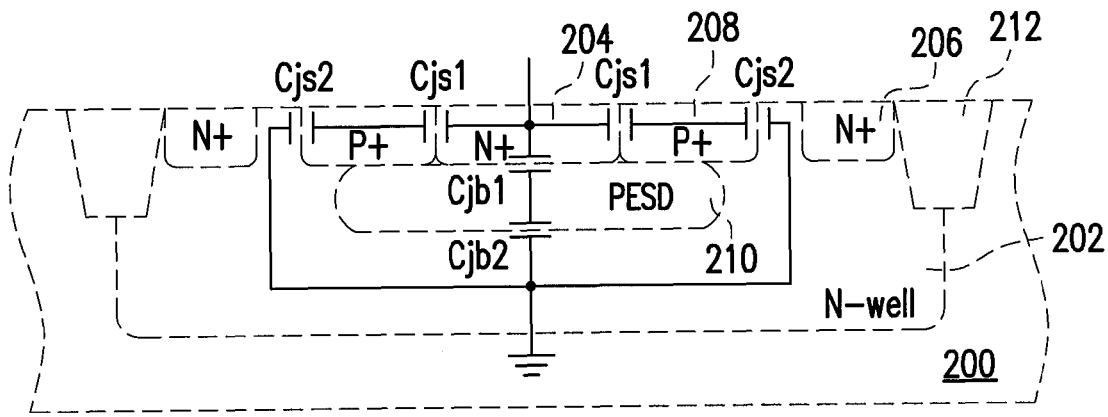
FIG. 3A schematically illustrates, in a circuit diagram, the ESD protection device shown in FIG. 2A according to an example of the first embodiment of the present invention.
Figure 3B:
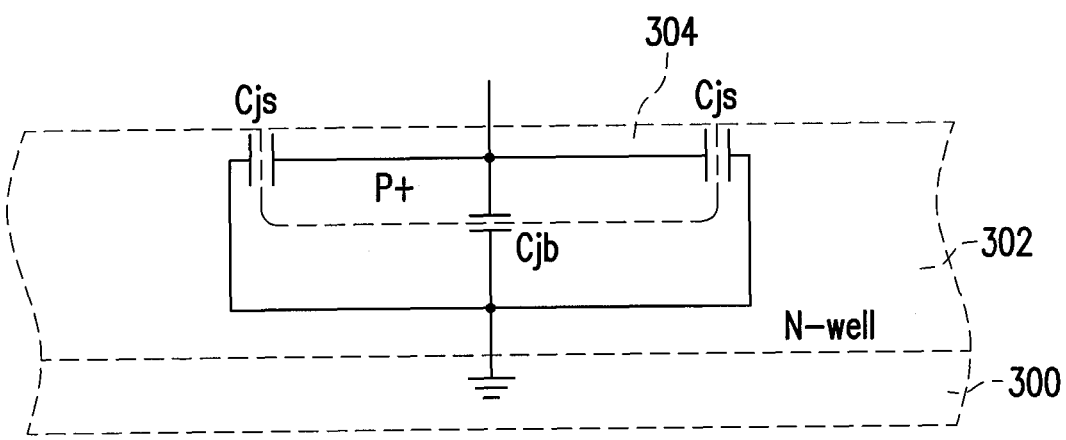
FIG. 3B schematically illustrates, in a circuit diagram, a conventional diode utilized for ESD protection.

The following is provided to illustrate the ESD protection device in the present invention has a lower equivalent capacitance $C_{ESD}$. This example is provided to illustrate effects upon the capacitance made by the deployment of the second P-type doped region 210 (PESD implant region), but is not intended to limit the scope of the present invention. FIG. 3A schematically illustrates, in a circuit diagram, the ESD protection device shown in FIG. 2A according to an example of the first embodiment of the present invention. FIG. 3B schematically illustrates, in a circuit diagram, a conventional diode utilized for ESD protection. The identical elements shown in FIGS. 3A and 2B are designated with the same reference numbers, and detailed descriptions of the same or like elements are omitted hereinafter.

Referring to FIG. 3A, regarding the vertical BJT in the ESD protection device, the capacitance $C_{jb1}$ at the junction between the first N-type doped region 204 and the second P-type doped region 210 is connected in series with the capacitance $C_{jb2}$ at the junction between the second P-type doped region 210 and the N-well region 202. Regarding the lateral BJT in the ESD protection device, the capacitance $C_{js1}$ at the junction between the first N-type doped region 204 and the first P-type doped region 208 is connected in series with the capacitance $C_{js2}$ at the junction between the first P-type doped region 208 and the N-well region 202. The N-well region 202 is grounded. The equivalent capacitance $C_{ESD}$ of the ESD protection device is expressed by Eq. (1):

$$C_{ESD} = \frac{Cjb1 \times Cjb2}{Cjb1 + Cjb2} + 2 \times \frac{Cjs1 \times Cjs2}{Cjs1 + Cjs2} \quad (1)$$

The lateral capacitance ($C_{js1}$ and $C_{js2}$) is much smaller than the underneath capacitance ($C_{jb1}$ and $C_{jb2}$) owing to the contact area thereof. Assuming the underneath capacitance is the same ($C_{jb1}=C_{jb2}=C_{jb}$) and the lateral capacitance $C_{js}$ can be ignored, the capacitance $C_{ESD}$ of the device will approximate 0.667 $C_{jb}$ ($C_{ESD} \approx 0.667 \times C_{jb}$).

By contrast, regarding the conventional diode shown in FIG. 3B, the underneath capacitance $C_{jb}$ and the lateral capacitance $C_{js}$ exist at the junction between the P-type doped region 304 and the N-well region 302, respectively. The N-well region 302 is grounded. Likewise, assuming the lateral capacitance $C_{js}$ can be ignored, the equivalent capacitance $C_{ESD}$ of the diode for ESD protection will approximate the vertical capacitance $C_{jb}$ ($C_{ESD} \approx C_{jb}$).

It is noted that the equivalent capacitance $C_{ESD}$ of the ESD protection device in an embodiment of the present invention is smaller than that of the single diode used for ESD protection. Thereby, the ESD protection device in an embodiment of the present invention is more suitable for high speed or RF applications. Beside, the ESD protection device in an embodiment of the present invention utilizes the vertical BJT to achieve ESD protection, and thus, the layout area of the ESD protection device can be designed much smaller than that of the GGNMOS.

Figure 4:
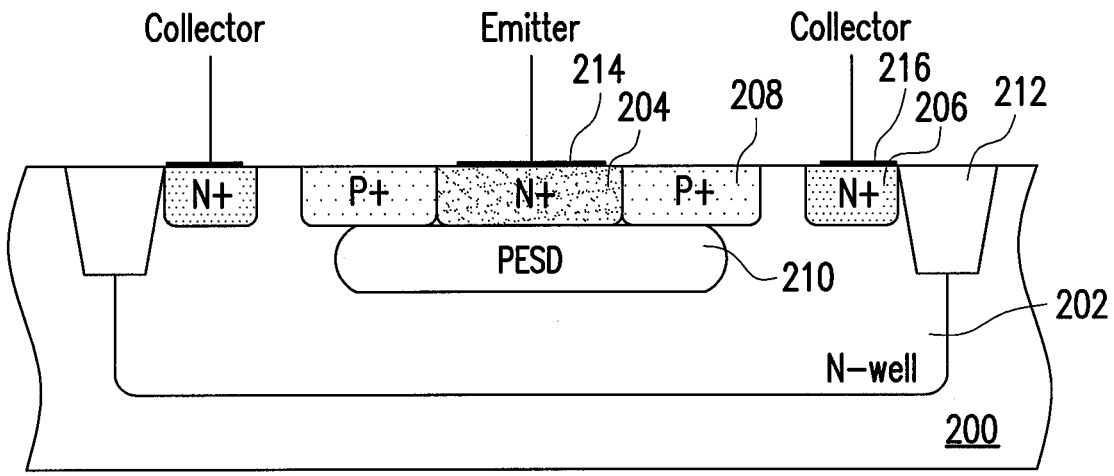
FIG. 4 is schematic, cross-sectional-diagram of the ESD protection device shown in FIG. 2A along line I-I according to another example of the first embodiment of the present invention.

FIG. 4 is schematic, cross-sectional diagram of the ESD protection device shown in FIG. 2A along line I-I according to another example of the first embodiment of the present invention. The identical elements shown in FIGS. 4 and 2B are designated with the same reference numbers, and detailed descriptions of the same or like elements are omitted hereinafter.

In another example, the structure of the ESD protection device shown in FIG. 4 is identical to that shown in FIG. 2B, while the difference lies in the manner of disposing the collector and emitter terminals. The first N-type doped region 204 deployed in the central portion serves as an emitter, while the N-well region 202 serves as a collector and is coupled to the second N-type doped region 206. The second P-type doped region 210 and the first P-type doped region 208 still constitute a base to compass the first N-type doped region 204 laterally and underneath.

Figure 5:
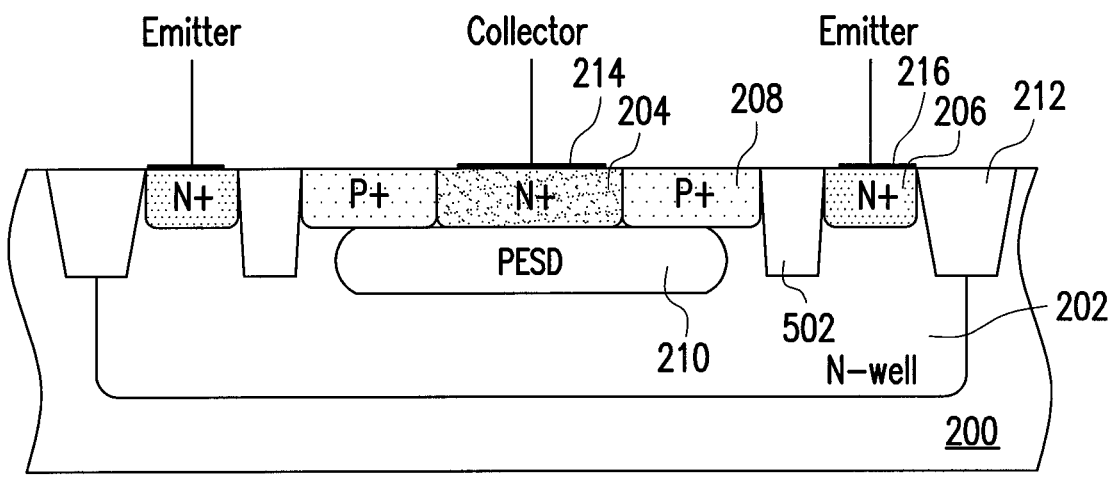
FIG. 5 schematically illustrates a cross-sectional diagram of the ESD protection device according to a second embodiment of the present invention.

FIG. 5 schematically illustrates a cross-sectional diagram of the ESD protection device according to a second embodiment of the present invention. The identical elements shown in FIGS. 5 and 2B are designated with the same reference numbers, and detailed descriptions of the same or like elements are omitted hereinafter.

In the second embodiment, as shown in FIG. 5, the ESD protection device can further include an isolation structure 502. The isolation structure 502 is disposed between the second N-type doped region 206 and the first P-type doped region 208. The isolation structure 502 encircles the profile of the first P-type doped region 208, for example. The isolation structure 502 can be an STI structure.

Figure 6A:
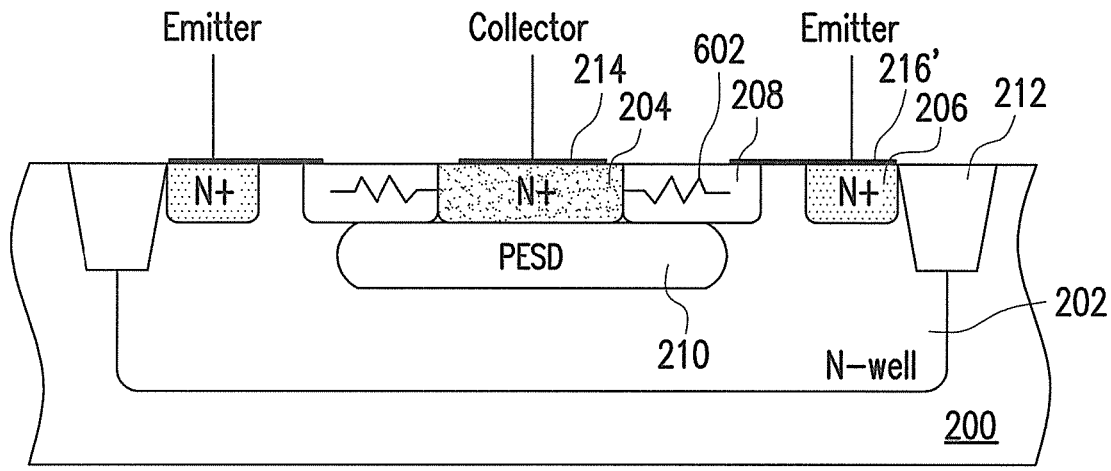
FIG. 6A schematically illustrates a cross-sectional diagram of the ESD protection device according to a third embodiment of the present invention.
Figure 6B:
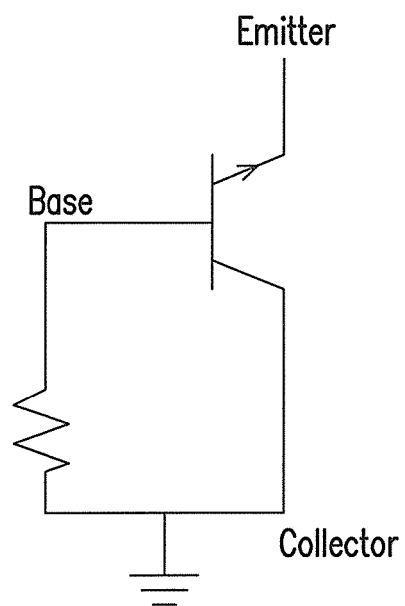
FIG. 6B depicts schematically, in an equivalent circuit, a vertical BJT in the ESD protection device according to the third embodiment of the present invention.

FIG. 6A schematically illustrates a cross-sectional diagram of the ESD protection device according to a third embodiment of the present invention. FIG. 6B depicts schematically, in an equivalent circuit, a vertical BJT in the ESD protection device according to the third embodiment of the present invention. The identical elements shown in FIGS. 6A and 2B are designated with the same reference numbers, and detailed descriptions of the same or like elements are omitted hereinafter.

Referring to FIG. 6A, the constructing elements of the ESD protection device are roughly identical to those shown in FIG. 2B, while the difference lies in the disposition of the salicide layer 216'. In the third embodiment, the salicide layer 216' is disposed not only on the surface of the second N-type doped region 206 but on at least a portion of the surface of the first P-type doped region 208. That is to say, the salicide layer 216' connects the first P-type doped region 208 and the second N-type doped region 206, so as to form a resistance 602 between the first N-type doped region 204 and the first P-type doped region 208. Hence, the vertical NPN bipolar transistor with the resistance deployed between the base and the collector can be illustrated with an equivalent circuit, as shown in FIG. 6B.

It is noted that a portion of the first P-type doped region 208 which is covered by the salicide layer 216' can be varied, so as to trigger the value of the base resistance 602. Assuming the applied voltage is constant, the current of the base ($I_{base}$) is inversely proportional to the resistance of the base ($R_{base}$). Since the current of the ESD protection device ($I_{ESD}$) is directly proportional to the current of the base ($I_{base}$), the current ($I_{ESD}$) which the ESD protection device can afford depends upon the resistance of the base ($R_{base}$). Thus, the capability of the ESD protection device can be regulated by adjusting the value of the resistance 602, that is, by adjusting the position of the salicide layer 216' covering the first P-type doped region 208.

Figure 7A:
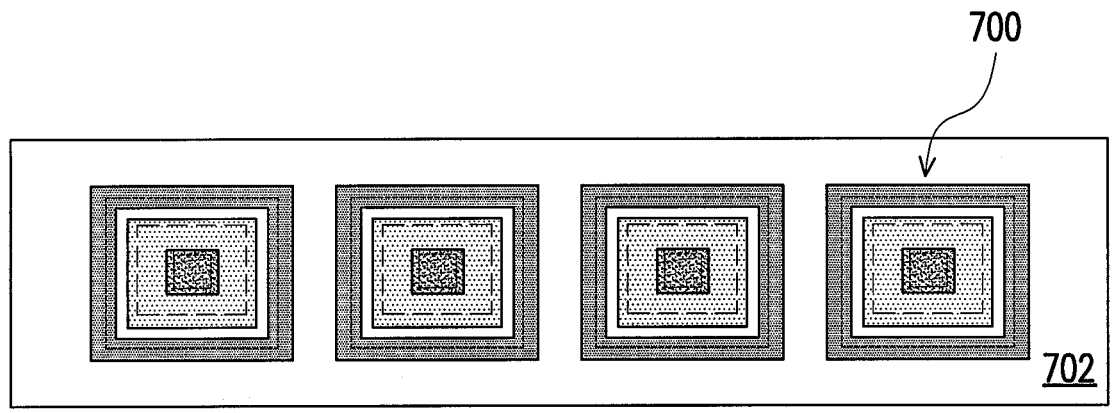
FIGS. 7A and 7B schematically illustrate a layout of such ESD protection devices according to two examples of an embodiment of the present invention.
Figure 7B:
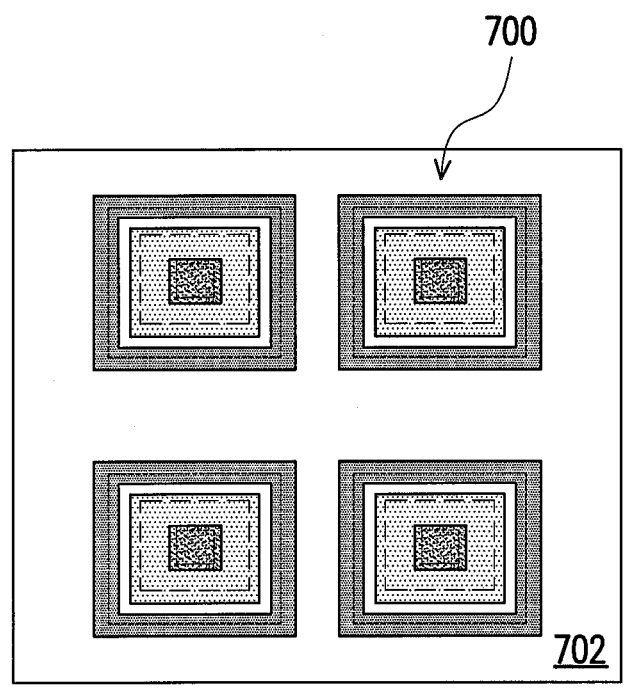

FIGS. 7A and 7B schematically illustrate a layout of such ESD protection devices according to two examples of an embodiment of the present invention.

A plurality of the ESD protection devices 700 described above can be connected in parallel to form an ESD protection array, as shown in FIGS. 7A and 7B respectively. To meet the requirements for the layout or current in practical applications, each ESD protection 700 can be regarded as a unit and coupled with one another in parallel via the N-well region 702 to form the array. It should be noted that FIGS. 7A and 7B are illustrated only as simplified exemplary examples in terms of four ESD protection devices, and should not be adopted for limiting the scope of the present invention. The number and the arrangement of the devices are not particularly limited by the present invention.

Moreover, the above-mentioned structures of the ESD protection device can be applied to many applications respectively, such that the ESD protection devices 130 and 140 for the IO buffer or the ESD protection device 150 for power bus, as shown in FIG. 1.

In view of the above, the ESD protection device in the present invention includes a vertical bipolar transistor, and thus the equivalent capacitance $C_{ESD}$ and the layout area of the ESD protection device can be diminished effectively. Accordingly, the ESD protection device is more suitable for high speed or RF applications. Besides, the ESD protection capability of the ESD protection device can be further regulated by adjusting the position of the salicide layer.

Further, the ESD protection device in the present invention can be incorporated into the current logic process, so as to simplify the fabrication process without raising the cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection device, comprising:
    an N-well region, configured in a substrate;
    a first N-type doped region, configured in the N-well region;
    a first P-type doped region, configured in the N-well region and surrounding the first N-type doped region and directly connecting to the first N-type doped region;
    a second N-type doped region, configured in the N-well region and surrounding the first N-type doped region and the first P-type doped region, wherein the second N-type doped region and the first P-type doped region are separated from each other; and
    a second P-type doped region, configured in the N-well region and under the first N-type doped region and the first P-type doped region, wherein the second P-type doped region is coupled with the first N-type doped region and with the first P-type doped region, respectively, and the second P-type doped region does not exceed an outer boundary of the first P-type doped region.

2. The ESD protection device according to claim 1, further comprising:
    a first salicide layer, disposed on a surface of the first N-type doped region; and
    a second salicide layer, disposed on a surface of the second N-type doped region.

3. The ESD protection device according to claim 2, wherein the second salicide layer is further extends on at least a portion of a surface of the first P-type doped region.

4. The ESD protection device according to claim 1, further comprising an isolation structure, disposed between the second N-type doped region and the first P-type doped region.

5. The ESD protection device according to claim 1, further comprising an isolation structure, disposed between the N-well region and the substrate.

6. The ESD protection device according to claim 1, wherein a doping concentration of the second P-type doped region is higher than a doping concentration of the N-well region and is lower than a doping concentration of the first P-type doped region.

7. The ESD protection device according to claim 1, wherein the first N-type doped region is coupled to a collector terminal and the second N-type doped region is coupled to an emitter terminal.

8. The ESD protection device according to claim 1, wherein the first N-type doped region is coupled to an emitter terminal and the second N-type doped region is coupled to a collector terminal.

9. An ESD protection device, comprising:
    a substrate of a first conductivity type;
    a well region of a second conductivity type, configured in the substrate;
    a first doped region of the second conductivity type, configured in the well region;
    a second doped region of the first conductivity type, configured in the well region and surrounding the first doped region and directly connecting to the first doped region;
    a third doped region of the second conductivity type, configured in the well region and surrounding the first doped region and the second doped region, wherein the third doped region and the second doped region are separated from each other; and
    a fourth doped region of the first conductivity type, configured in the well region and under the first doped region and the second doped region, wherein the fourth doped region is coupled with the first doped region and with the second doped region, respectively, and the fourth doped region does not exceed an outer boundary of the second doped region.

10. The ESD protection device according to claim 9, further comprising:
    a first salicide layer, disposed on a surface of the first doped region; and
    a second salicide layer, disposed on a surface of the third doped region.

11. The ESD protection device according to claim 10, wherein the second salicide layer is further extends on at least a portion of a surface of the second doped region.

12. The ESD protection device according to claim 9, further comprising an isolation structure, disposed between the third doped region and the second doped region.

13. The ESD protection device according to claim 9, further comprising an isolation structure, disposed between the well region and the substrate.

14. The ESD protection device according to claim 9, wherein a doping concentration of the fourth doped region is higher than a doping concentration of the well region and is lower than a doping concentration of the second doped region.

15. The ESD protection device according to claim 9, wherein the first doped region is coupled to a collector terminal and the third doped region is coupled to an emitter terminal.

16. The ESD protection device according to claim 9, wherein the first doped region is coupled to an emitter terminal and the third doped region is coupled to a collector terminal.

17. The ESD protection device according to claim 9, wherein the first conductivity type is P-type and the second conductivity is N-type.

18. The ESD protection device according to claim 9, wherein the first conductivity type is N-type and the second conductivity is P-type.

* * * * *